(12) United States Patent
Jo et al.

(10) Patent No.: US 10,270,405 B2
(45) Date of Patent: Apr. 23, 2019

(54) RADIO FREQUENCY SWITCH APPARATUS WITH IMPROVED HARMONIC ATTENUATION CHARACTERISTICS

(71) Applicant: Samsung Electro-Mechanics Co., Ltd., Suwon-si (KR)

(72) Inventors: Byeong Hak Jo, Suwon-si (KR); Jeong Hoon Kim, Suwon-si (KR); Hyun Paek, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 3 days.

(21) Appl. No.: 15/813,234

(22) Filed: Nov. 15, 2017

(65) Prior Publication Data

US 2019/0007006 A1    Jan. 3, 2019

(30) Foreign Application Priority Data

Jun. 28, 2017  (KR) .......................... 10-2017-0081848

(51) Int. Cl.
| | |
|---|---|
| *H01L 27/06* | (2006.01) |
| *H01L 27/07* | (2006.01) |
| *H03K 17/16* | (2006.01) |
| *H03F 3/193* | (2006.01) |
| *H03F 3/72* | (2006.01) |
| *H03H 9/00* | (2006.01) |

(52) U.S. Cl.
CPC ............... *H03F 3/193* (2013.01); *H03F 3/72* (2013.01); *H03H 9/0014* (2013.01); *H03H 9/0028* (2013.01); *H03F 2200/211* (2013.01); *H03F 2200/387* (2013.01); *H03F 2200/411* (2013.01); *H03F 2200/451* (2013.01)

(58) Field of Classification Search
CPC .......... H01P 1/15; H01L 27/07; H01L 27/011; H01L 27/0629; H01L 27/06; H03K 17/16
USPC .................... 333/103; 257/532, 541
See application file for complete search history.

(56) References Cited

U.S. PATENT DOCUMENTS

| | | | |
|---|---|---|---|
| 7,910,993 B2 * | 3/2011 | Brindle | H01L 29/78609 257/347 |
| 9,461,037 B2 | 10/2016 | Genc | |
| 9,509,363 B2 * | 11/2016 | Madan | H03K 17/162 |
| 9,628,075 B2 * | 4/2017 | Cebi | H03K 17/687 |

(Continued)

OTHER PUBLICATIONS

Korean Office Action dated Feb. 9, 2018 in corresponding Korean Patent Application No. 10-2017-0081848 (6 pages in English and 4 pages in Korean).

*Primary Examiner* — Dean O Takaoka
(74) *Attorney, Agent, or Firm* — NSIP Law

(57) ABSTRACT

A radio frequency (RF) switch apparatus includes a signal input terminal; a signal output terminal; a first transistor including a first input terminal connected to the signal input terminal, a first output terminal connected to the signal output terminal, a first gate terminal, and a first body terminal, wherein one of the first input terminal and the first output terminal is a source terminal and another one of the first input terminal and the first output terminal is a drain terminal; a first capacitor circuit connected between the first input terminal and the first body terminal; and a second capacitor circuit connected between the first body terminal and the first output terminal; wherein a first capacitance of the first capacitor circuit is greater than a second capacitance of the second capacitor circuit.

20 Claims, 8 Drawing Sheets

(56) References Cited

U.S. PATENT DOCUMENTS

| | | | |
|---|---|---|---|
| 9,979,362 B2* | 5/2018 | Kang | ........................ H03F 1/56 |
| 2015/0222260 A1 | 8/2015 | Genc | |
| 2015/0341026 A1 | 11/2015 | de Jongh | |

* cited by examiner

RADIO FREQUENCY SWITCH APPARATUS WITH IMPROVED HARMONIC ATTENUATION CHARACTERISTICS

CROSS-REFERENCE TO RELATED APPLICATIONS

This application claims the benefit under 35 USC 119(a) of Korean Patent Application No. 10-2017-0081848 filed on Jun. 28, 2017, in the Korean Intellectual Property Office, the entire disclosure of which is incorporated herein by reference for all purposes.

BACKGROUND

1. Field

The following description relates to a radio frequency switch apparatus having improved harmonic attenuation characteristics.

2. Description of Related Art

In general, a power amplifier module (PAM) amplifies a radio frequency (RF) signal output from a transmitter, and outputs the amplified RF signal to an antenna. To support various frequency bands, the PAM may include a power amplifier (PA), a low noise amplifier (LNA), a band selection switch, multiple filters, and an antenna switch module (ASM).

The filters of the PAM may be a surface acoustic wave (SAW) filter or a bulk acoustic wave (BAW) filter, and may be called a duplexer, triplexer, a quadplexer, or other appropriate name depending on the number of frequency bands being used.

The band selection switch may have a form determined according to a configuration of the power amplifier (PA) and the filters, and since the power amplifier is typically designed to operate in a wide band including a plurality of bands, the band selection switch may be implemented as a single-pole multi-throw switch having a single input terminal and multiple output terminals each connected to a corresponding one of the filters.

The band selection switch or the antenna switch module has various performance indexes such as insertion loss, isolation, power capability, and second harmonic characteristics. Among these, second harmonic characteristics is one of the main performance indexes for evaluating the linearity of the band selection switch or the antenna switch module, and is particularly a more important performance index in a reception RX path between the filter and the low noise amplifier (LNA). In the band selection switch or the antenna switch module, an RF switch using a field-effect transistor (FET) may have a multistage stack structure in which multiple FETs are connected to each other to provide a desired power capability. The number of FETs stacked in the multistage stack structure may be varied depending on an amplitude of an input signal.

However, the FET applied to an existing switch apparatus includes four nodes, i.e., a gate node, a source node, a drain node, and a body node, and minute differences in capacitance may occur between a drain-body junction capacitance Cdb and a source-body junction capacitance Csb of the FET due to an operation deviation or a metal routing deviation, and these differences in capacitance may affect the second harmonic characteristics of the existing switch apparatus.

A structure for correcting the differences in capacitances between the junction capacitors of the FET has been disclosed in U.S. Pat. No. 9,461,037 entitled "Reduced Generation of Second Harmonics of FETs." The structure described in U.S. Pat. No. 9,461,037 improves the second harmonic characteristic by forming the FET to have a symmetrical structure so that parasitic capacitances that are additionally generated in the drain-body junction capacitance Cdb and the source-body junction capacitance Csb are equal to each other.

However, regarding the structure of the switch disclosed in U.S. Pat. No. 9,461,037, a phase difference caused by the drain-body junction capacitance Cdb and the source-body junction capacitance Csb still occurs. As a result, even in a case in which the drain-body junction capacitance Cdb and the source-body junction capacitance Csb are equalized, since magnitudes of voltages across the drain-body junction capacitance Cdb and the source-body junction capacitance Csb are equal to each other, but phases of signals across the body and the gate are different, the second harmonic characteristics are not optimized.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a radio frequency (RF) switch apparatus includes a signal input terminal; a signal output terminal; a first transistor including a first input terminal connected to the signal input terminal, a first output terminal connected to the signal output terminal, a first gate terminal, and a first body terminal, wherein one of the first input terminal and the first output terminal is a source terminal and another one of the first input terminal and the first output terminal is a drain terminal; a first capacitor circuit connected between the first input terminal and the first body terminal; and a second capacitor circuit connected between the first body terminal and the first output terminal; wherein a first capacitance of the first capacitor circuit is greater than a second capacitance of the second capacitor circuit.

The first capacitor circuit may include a first junction capacitor connected between the first body terminal and the first input terminal; and a first phase compensating capacitor connected in parallel with the first junction capacitor.

The first phase compensating capacitor may include a variable capacitor circuit having a capacitance that varies in response to a first external control signal.

The first transistor may further include a body pattern corresponding to the first body terminal, and a drain pattern corresponding to the first input terminal; and a capacitance of the first phase compensating capacitor may depend on an area of an overlap between the body pattern corresponding to the first body terminal and the drain pattern corresponding to the first input terminal.

The second capacitor circuit may include a second junction capacitor connected between the first body terminal and the first output terminal.

The first capacitance may be greater than the second capacitance and less than three times the second capacitance.

In another general aspect, a radio frequency (RF) switch apparatus includes a signal input terminal; a signal output terminal; and first to n-th switches connected in series between the signal input terminal and the signal output terminal, where n is a natural number of two or more; wherein the first switch includes a first transistor including a first input terminal connected to the signal input terminal, a first output terminal, a first gate terminal, and a first body terminal, wherein one of the first input terminal and the first output terminal is a source terminal and another one of the first input terminal and the first output terminal is a drain terminal, a first capacitor circuit connected between the first input terminal and the first body terminal, and a second capacitor circuit connected between the first body terminal and the first output terminal; and a first capacitance of the first capacitor circuit of the first switch is greater than a second capacitance of the second capacitor circuit of the first switch.

The first capacitor circuit may include a first junction capacitor connected between the first body terminal and the first input terminal; and a first phase compensating capacitor connected in parallel with the first junction capacitor.

The first phase compensating capacitor may include a variable capacitor circuit having a capacitance that varies in response to a first external control signal.

The first transistor further includes a body pattern corresponding to the first body terminal, and a drain pattern corresponding to the first input terminal; and a capacitance of the first phase compensating capacitor may depend on an area of an overlap between the body pattern corresponding to the first body terminal and the drain pattern corresponding to the first input terminal.

The n-th switch may include an n-th transistor including an n-th input terminal connected to an n-1-th output terminal of an n-1-th switch of the first to n-th switches, an n-th output terminal connected to the signal output terminal, an n-th gate terminal, and an n-th body terminal, wherein one of the n-th input terminal and the n-th output terminal is a source terminal and another one of the n-th input terminal and the n-th output terminal is a drain terminal; a first capacitor circuit connected between the n-th input terminal and the n-th body terminal; and a second capacitor circuit connected between the n-th body terminal and the n-th output terminal; wherein a first capacitance of the first capacitor circuit of the n-th switch may be greater than a second capacitance of the second capacitor circuit of the n-th switch.

The second capacitor circuit may include a second junction capacitor connected between the first body terminal and the first output terminal.

The first capacitance may be greater than the second capacitance and less than three times the second capacitance.

In another general aspect, a radio frequency (RF) switch apparatus includes a signal input terminal; a signal output terminal; a transistor including an input terminal connected to the signal input terminal, an output terminal connected to the signal output terminal, a gate terminal, and a body terminal, wherein one of the input terminal and the output terminal is a source terminal and another one of the input terminal and the output terminal is a drain terminal; and a capacitor connected between the input terminal and the body terminal and having a capacitance that causes a difference between a gate leakage current of the transistor and a body leakage current of the transistor to occur at substantially a zero crossing point of an RF signal applied to the signal input terminal.

A sum of the capacitance of the capacitor and a first junction capacitance between the body terminal and the input terminal may be greater than a second junction capacitance between the body terminal and the output terminal.

The sum of the capacitance of the capacitor and the first junction capacitance may be greater than the second junction capacitance and less than three times the second junction capacitance.

The sum of the capacitance of the capacitor and the first junction capacitance may be substantially two times the second junction capacitance.

The capacitance of the capacitor may cause a phase of a gate voltage of the gate terminal to be equal to a phase of a body voltage of the body terminal.

The capacitor may include a variable capacitor circuit having a capacitance that varies in response to an external control signal.

The transistor may further include a body pattern corresponding to the body terminal, and a drain or source pattern corresponding to the input terminal; and the capacitance of the capacitor may depend on an area of an overlap between the body pattern corresponding to the body terminal and the drain or source pattern corresponding to the input terminal.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
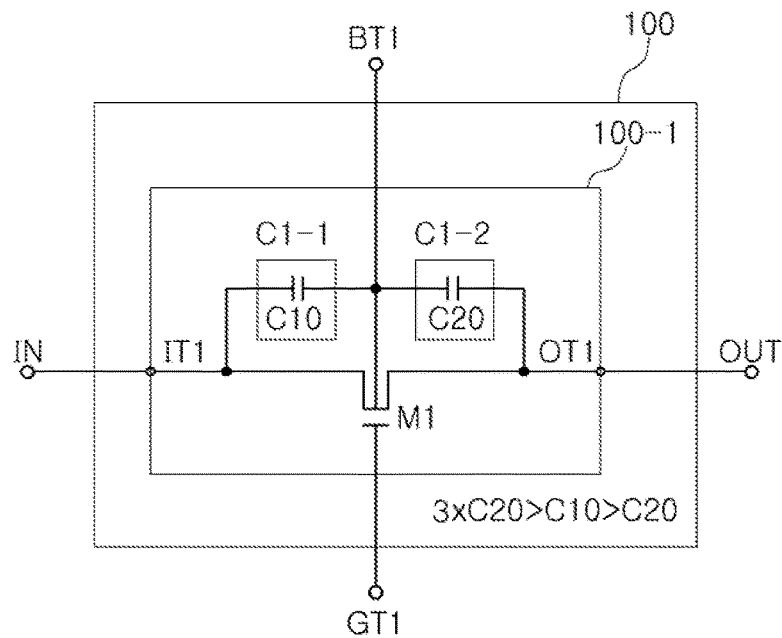
FIG. 1 is a view of an example of a radio frequency (RF) switch apparatus.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. The sequences of operations described herein are merely examples, and are not limited to those set forth herein, but may be changed as will be apparent after an understanding of the disclosure of this application, with the exception of operations necessarily occurring in a certain order. Also, descriptions of functions and constructions that are well known in the art maybe omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or wafer (substrate), is described as being "on," "connected to," or "coupled to" another element, it can be directly "on," "connected to," or "coupled to" the other element, or there may be other elements intervening therebetween. In contrast, when an element is referred to as being "directly on," "directly connected to," or "directly coupled to" another element, there can be no other elements or layers intervening therebetween.

As used herein, the term "and/or" includes any and all combinations of one or more of the associated listed items.

Although terms such as "first," "second," and "third" maybe used herein to describe various members, components, regions, layers, and/or sections, these members, components, regions, layers, and/or sections are not to be limited by these terms. Rather, these terms are only used to distinguish one member, component, region, layer, or section from another member, component, region, layer, or section. Thus, a first member, component, region, layer, or section referred to in an example below could also be referred to as a second member, component, region, layer, or section without departing from the teachings of the example.

Spatially relative terms, such as "above," "upper," "below," and "lower," may be used herein for ease of description to describe one element's relationship to another element as shown in the figures. Such spatially relative terms are intended to encompass different orientations of the device in use or operation in addition to the orientation depicted in the figures. For example, if the device in the figures is turned over, elements described as "above" or "upper" relative to other elements would then be oriented "below" or "lower" relative to the other elements. Thus, the term "above" can encompass both the above and below orientations depending on a particular direction of the figures. The device may be otherwise oriented (rotated degrees or at other orientations), and the spatially relative terms used herein are to be interpreted accordingly.

The terminology used herein is for describing particular examples only, and is not intended to limit the disclosure. The terms "a," "an," and "the" include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings maybe occur. Thus, the examples described below are not to be construed as being limited to the particular shapes of regions shown in the drawings, but include changes in shape occurring during manufacturing.

FIG. 1 is a view of an example of a radio frequency (RF) switch apparatus.

Referring to FIG. 1, a radio frequency (RF) switch apparatus 100 includes a first switch 100-1 connected between a signal input terminal IN and a signal output terminal OUT.

The first switch 100-1 includes a first transistor M1, a first capacitor circuit C1-1, and a second capacitor circuit C1-2.

The first transistor M1 includes a first input terminal IT1 connected to the signal input terminal IN, a first output terminal OT1 connected to the signal output terminal OUT, a first gate terminal GT1, and a first body terminal BT1. One of the first input terminal IT1 and the first output terminal OT1 is a source terminal, and the other one of the first input terminal IT1 and the first output terminal OT1 is a drain terminal.

The first capacitor circuit C1-1 is connected between the first input terminal IT1 and the first body terminal BT1 of the first transistor M1.

The second capacitor circuit C1-2 is connected between the first body terminal BT1 and the first output terminal OT1 of the first transistor M1.

A first capacitance C10 of the first capacitor circuit C1-1 is set to be greater than a second capacitance C20 of the second capacitor circuit C1-2. For example, the first capacitance C10 of the first capacitor circuit C1-1 is set as expressed in Equation 1 below.

Figure 2:
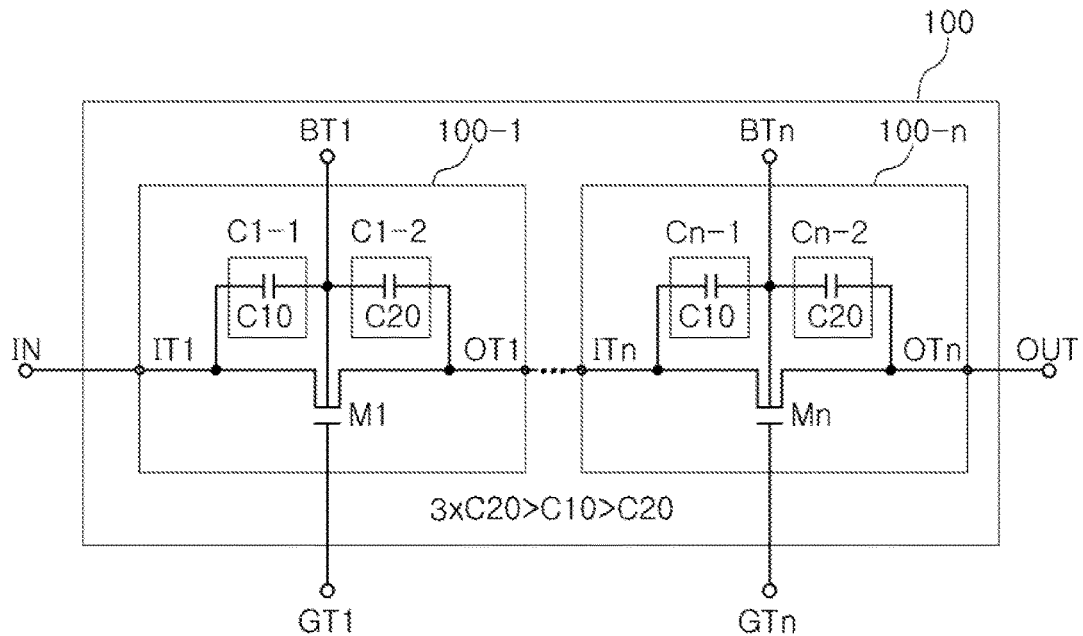
FIG. 2 is a view of another example of a radio frequency (RF) switch apparatus.

FIG. 2 is a view of another example of a radio frequency (RF) switch apparatus.

Referring to FIG. 2, a radio frequency (RF) switch apparatus 100 includes a first switch 100-1 to an n-th switch 100-$n$ connected in series between the signal input terminal IN and the signal output terminal OUT in series, where n is a natural number of 2 or more.

The first switch 100-1 includes the first transistor M1, the first capacitor circuit C1-1, and the second capacitor circuit C1-2.

The first transistor M1 includes the first input terminal IT1 connected to the signal input terminal IN, the first output terminal OT1, the first gate terminal GT1, and the first body terminal BT1. One of the first input terminal IT1 and the first output terminal OT1 is a source terminal, and the other one of the first input terminal IT1 and the first output terminal OT1 is a drain terminal.

The first capacitor circuit C1-1 of the first transistor M1 is connected between the first input terminal IT1 and the first body terminal BT1.

The second capacitor circuit C1-2 of the first transistor M1 is connected between the first body terminal BT1 and the first output terminal OT1.

A first capacitance C10 of the first capacitor circuit C1-1 of the first switch 100-1 is set to be greater than a second capacitance C20 of the second capacitor circuit C1-2 of the first switch 100-1.

The n-th switch 100-$n$ includes an n-th transistor Mn, a first capacitor circuit Cn-1, and a second capacitor circuit Cn-2.

The n-th transistor Mn includes an n-th input terminal ITn connected to an n-1-th output terminal of an n-1-th switch, an n-th output terminal OTn connected to the signal output terminal OUT, an n-th gate terminal GTn, and an n-th body terminal BTn. One of the n-th input terminal ITn and the n-th output terminal OTn is a source terminal, and the other one of the n-th input terminal ITn and the n-th output terminal OTn is a drain terminal.

The first capacitor circuit Cn-1 of the n-th transistor Mn is connected between the n-th input terminal ITn and the n-th body terminal BTn.

The second capacitor circuit Cn-2 of the n-th transistor Mn is connected between the n-th body terminal BTn and the n-th output terminal OTn.

A first capacitance C10 of the first capacitor circuit Cn-1 of the n-th switch 100-n is set to be greater than a second capacitance C20 of the second capacitor circuit Cn-2 of the n-th switch 100-n. For example, the first capacitance C10 of the first capacitor circuits C1-1 and Cn-1 is set as expressed in Equation 1 below.

In FIGS. 1 and 2, the first to n-th transistors M1 to Mn may be a field effect transistor (FET), but are not limited thereto.

In this description, repeated descriptions may be omitted for components in the drawings having the same reference numerals and the same function, and only differences between the drawings may be described.

Figure 3:
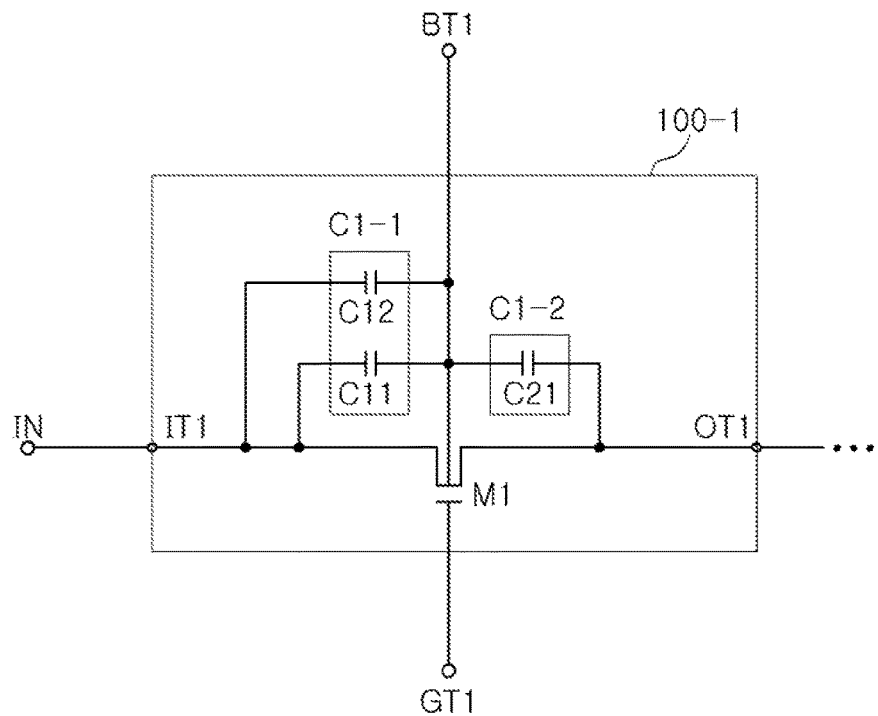
FIG. 3 is a view of an example of a first switch.
Figure 4:
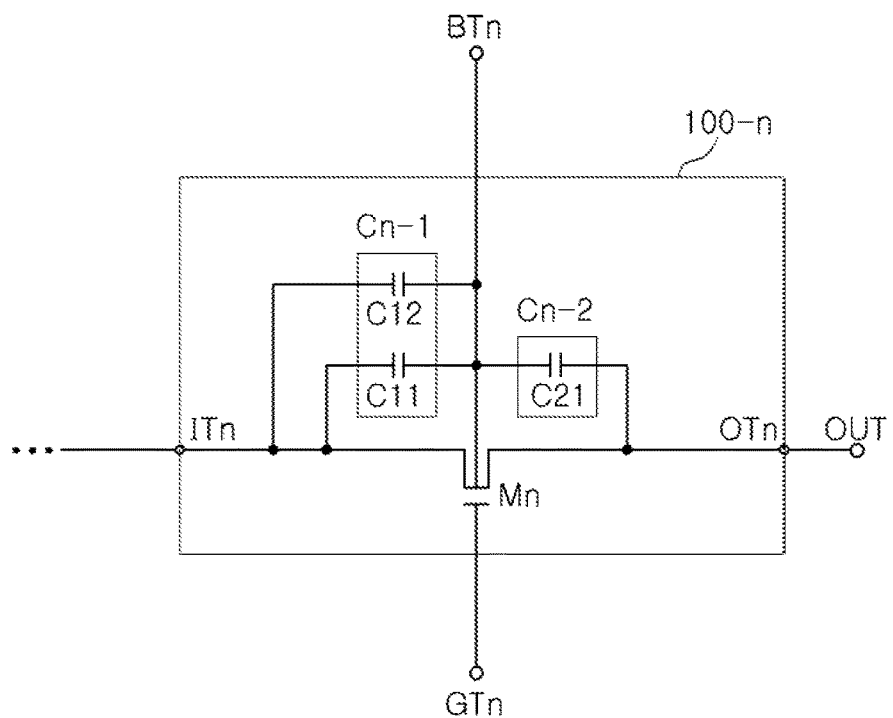
FIG. 4 is a view of an example of an n-th switch.

FIG. 3 is a view of an example of a first switch, and FIG. 4 is a view of an example of an n-th switch.

Referring to FIG. 3, the first capacitor circuit C1-1 includes a first junction capacitor C11 and a first phase compensating capacitor C12.

The first junction capacitor C11 is connected between the first body terminal BT1 and the first input terminal IT1.

The first phase compensating capacitor C12 is connected in parallel with the first junction capacitor C11.

The second capacitor circuit C1-2 includes a second junction capacitor C21 connected between the first body terminal BT1 and the first output terminal OT1.

The first capacitance C10 of the first capacitor circuit C1-1 is determined by the first junction capacitor C11 and the first phase compensating capacitor C12 that are connected in parallel with each other. Since the first capacitance C10 is increased when the first junction capacitor C11 and the first phase compensating capacitor C12 are connected in parallel with each other, the first capacitance C10 is set to be greater than a capacitance of the first junction capacitor C11, greater than a capacitance of the second junction capacitor C21, and greater than the second capacitance C20 of the second capacitor circuit C1-2.

Referring to FIG. 4, the first capacitor circuit Cn-1 includes the first junction capacitor C11 and the first phase compensating capacitor C12.

The first junction capacitor C11 is connected between the n-th body terminal BTn and the n-th input terminal ITn.

The first phase compensating capacitor C12 is connected in parallel with the first junction capacitor C11.

The second capacitor circuit Cn-2 includes the second junction capacitor C21 connected between the n-th body terminal BTn and the n-th output terminal OTn.

The first capacitance C10 of the first capacitor circuit Cn-1 is determined by the capacitances of the first junction capacitor C11 and the first phase compensating capacitor C12 that are connected in parallel with each other. Since the first capacitance C10 is increased when the first junction capacitor C11 and the first phase compensating capacitor C12 are connected in parallel with each other, the first capacitance C10 is set to be greater than the capacitance of the first junction capacitor C11, greater than the capacitance of the second junction capacitor C21, and greater than the second capacitance C20 of the second capacitor circuit Cn-2.

Referring to FIGS. 1 through 4, in the first capacitor circuit C1-1 or each of the first capacitor circuit C1-1 to the n-th capacitor circuit Cn-1, the first capacitance C10 is set to be greater than the second capacitance C20 and less than three times the second capacitance C20 according to Equation 1 below.

$$3 \times C20 > C10 > C20 \tag{1}$$

For In the examples of FIGS. 1 and 2, the first capacitance C10 is set to be equal to twice the second capacitance C20.

Figure 5:
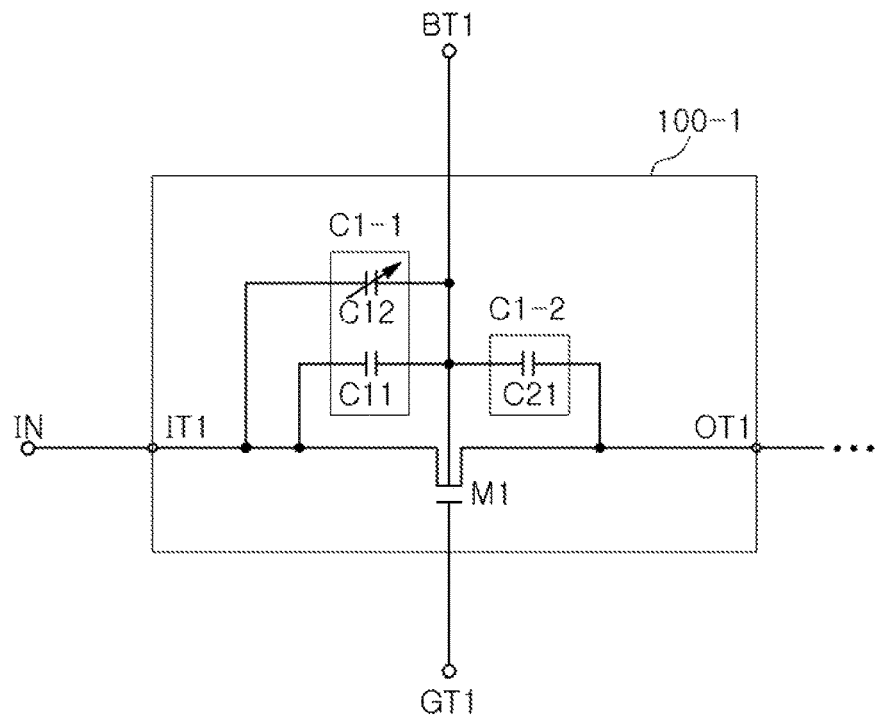
FIG. 5 is a view of another example of a first switch.
Figure 6:
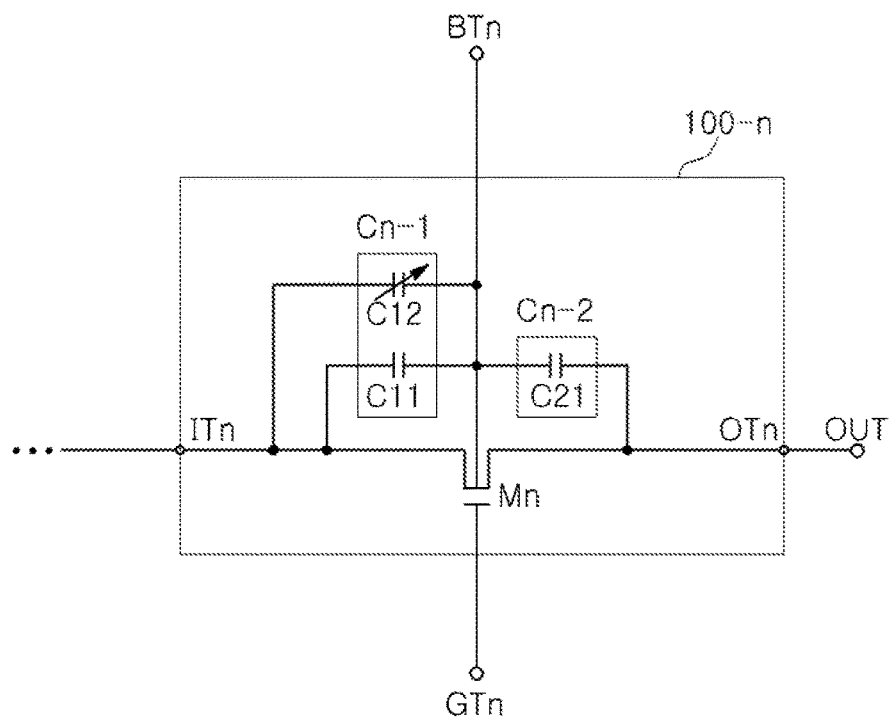
FIG. 6 is a view of another example of an n-th switch.

FIG. 5 is a view of another example of a first switch, and FIG. 6 is a view of another example of an n-th switch.

Referring to FIGS. 5 and 6, the first phase compensating capacitor C12 of each of the first capacitor circuit C1-1 and the n-th capacitor circuit Cn-1 includes a variable capacitor circuit having a variable capacitance that varies in response to a first external control signal.

For example, the variable capacitor circuit may be implemented by a circuit including a switch and multiple capacitors, or may be implemented by a variable capacitive element such as a varactor. However, the variable capacitor circuit is not limited to these examples, but may be implemented by any circuit capable of varying a capacitance FIG. 7A is a circuit diagram of an example of a transistor, FIG. 7B is a view of a layout illustrating an example of an arrangement structure of metal terminals of the transistor of FIG. 7A, and FIG. 7C is a view of a layout illustrating another example of an arrangement structure of the metal terminals of the transistor of FIG. 7A.

Figure 7A:
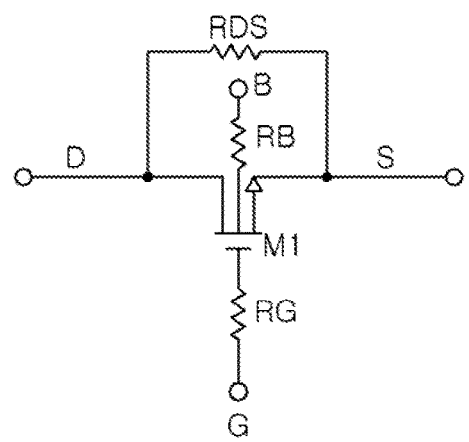
FIG. 7A is a circuit diagram of an example of a transistor.

FIG. 7A illustrates an example of a circuit structure of a transistor included in the first to n-th switches 100-1 to 100-n. A transistor M1 illustrated in FIG. 7A includes a drain terminal D, a source terminal S, a gate terminal S, and a body terminal B. The gate terminal G has a gate resistor RG connected thereto, and the body terminal B has a body resistor RB connected thereto. The drain terminal D and the source terminal S are connected to each other through a drain-source resistor RDS.

Figures 7B, 7C:
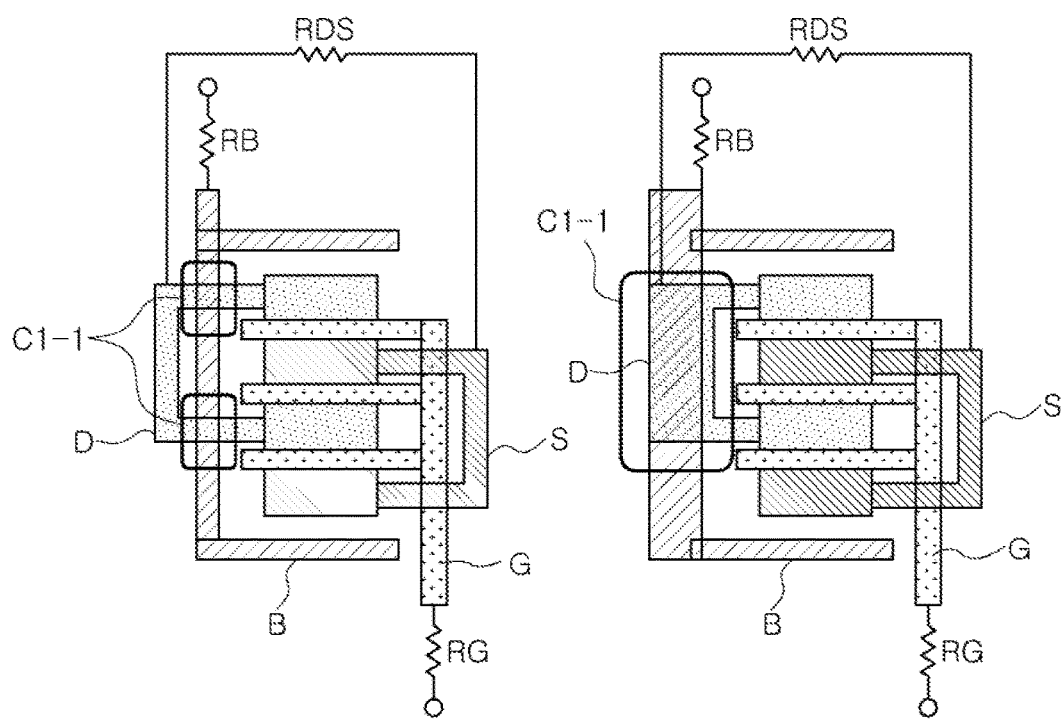
FIG. 7B is a view of a layout illustrating an example of an arrangement structure of metal terminals of the transistor of FIG. 7A.
FIG. 7C is a view of a layout illustrating another example of an arrangement structure of the metal terminals of the transistor of FIG. 7A.

In FIGS. 7B and 7C, referring to the layouts illustrating examples of the arrangement structure of the metal terminals of the transistor M1 of FIG. 7A, the metal terminals of the transistor M1 include the drain terminal D, the source terminal S, the gate terminal G, and the body terminal B, and the first capacitance C10 of the first capacitor circuit C1-1 is determined by an area of an overlap between the drain terminal and the body terminal. The greater the area of the overlap, the greater the capacitance.

For example, the capacitance of the first phase compensating capacitor C12 may be varied by adjusting an area of an overlap between a body pattern corresponding to a first body terminal of the first transistor M1 and a drain pattern corresponding to a first input terminal of the first transistor M1.

For example, in a case in which the input terminal is the drain terminal and the body terminal is disposed in the vicinity of the drain terminal, the body terminal and the drain terminal may be made of different metals, and the first capacitance C10, which is equal to a sum of the parasitic capacitance C12 (FIG. 4) resulting from the overlap of the body terminal and the drain terminal, and a drain-body junction capacitance C11 (FIG. 4), is set to about two times (e.g., C10=2×C20) the source-body junction capacitance C20 (FIG. 4).

The first capacitance C10 should be greater than the second capacitance C20, but how much greater it should be may vary depending on a structure and a size of the transistor M1 (e.g., depending on whether the transistor M1 is an FET).

Figure 8:
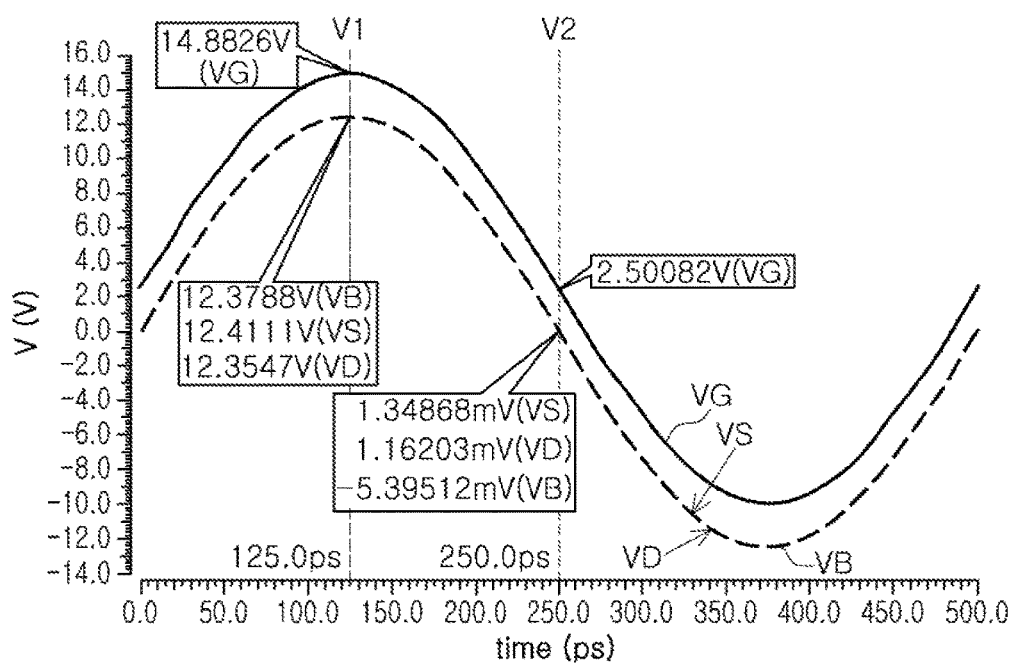
FIG. 8 is a view of node voltages of the transistor of FIG. 7A.

FIG. 8 is a view of an example of node voltages of the transistor of FIG. 7A.

In FIG. 8, an example of a waveform of each of a drain voltage VD, a source voltage VS, a gate voltage VG, and a base voltage VB of the transistor M1 of FIG. 7A is illustrated for an example in which an RF input signal having a frequency of 2 GHz and an amplitude of 32 dBm is input to the transistor M1.

Referring to FIG. 8, in the example illustrated in FIG. 8, when the transistor M1 of a switch is in an on-state, the gate voltage VG is about 2.5 V higher than voltages VD, VS, and VB of the other nodes. When the input signal is not input to the transistor M1, the gate-source voltage VGS, the gate-drain voltage VGD, and the gate-body voltage VGB have a constant voltage value, but when the input signal is input, each of these voltage values changes depending on the amplitude of the input signal, and the capacitances of the junction capacitors of the transistor change depending on the voltage of each node.

In addition, a voltage difference between the gate and the body has a minimum value at maximum and minimum points of the input signal, and in particular, a difference between a gate leakage current and a body leakage current has a maximum value at a zero crossing point of the RF input signal. At this point, the transistor M1 (an FET, for example) included in the switch has an optimal linearity. That is, the leakage currents generated through the gate resistor RG and the body resistor RB change depending on the gate voltage VG and the base voltage VB, and a difference between a gate leakage current Ileak_gate and a body leakage current Ileak_body will follow a difference between the gate voltage VG and the base voltage VB and will have a maximum value in the vicinity of the zero crossing point.

For example, in a case in which phases of the gate and body leakage currents coincide with each other, the difference between the gate and body leakage currents will have a maximum value accurately at the zero crossing point, which means that the phases of the gate voltage VG and the base voltage VB will coincide with each other, and this is an optimal point for second harmonic performance. For example, in a case in which the capacitances of the junction capacitors of the transistor M1 are all the same, the above-mentioned point will be the optimal point for second harmonic performance.

In practice, however, the capacitances of the gate-drain junction capacitor and the gate-source junction capacitor of the transistor are much greater than capacitances of the body-drain junction capacitor and the body-source junction capacitor of the capacitor, so the four junction capacitors will not all have the same value. Therefore, even if the capacitances of the body-drain junction capacitor and the body-source junction capacitor are the same, this will not be the optimal point for second harmonic performance.

As an example, in a case in which the switch transistor (an FET, for example) has a width of 3 mm, the body-drain capacitor and the body-source capacitor each have a capacitance of about 70 to 90 pF, and the gate-drain capacitor and the gate-source capacitor each have a capacitance of about 1.4 to 1.5 pF. These capacitances may vary depending on an operation or a size of the switch apparatus, but obviously show a great difference.

In this case, to make the phase of the gate voltage VG equal to the phase of the base voltage VB, the small capacitances of the body-drain capacitor and the body-source capacitor are adjusted rather than adjusting the much larger capacitances of the gate-drain capacitor and the gate-source capacitor.

In view of this fact, the gate voltage VG may be determined by performing a voltage division by the gate-drain capacitor, the gate-source capacitor, and the gate resistor RG, and the body voltage VB may be determined by performing a voltage division by the body-drain capacitor, the body-source capacitor, and the body resistor RB. As an example, it is one of the technical characteristics of the examples of the switch circuits disclosed in this application that the phase of the base voltage VB will be the same as the phase of the gate voltage VG when the body-drain capacitor between the body and the drain is adjusted to an appropriate capacitance.

Figure 9:
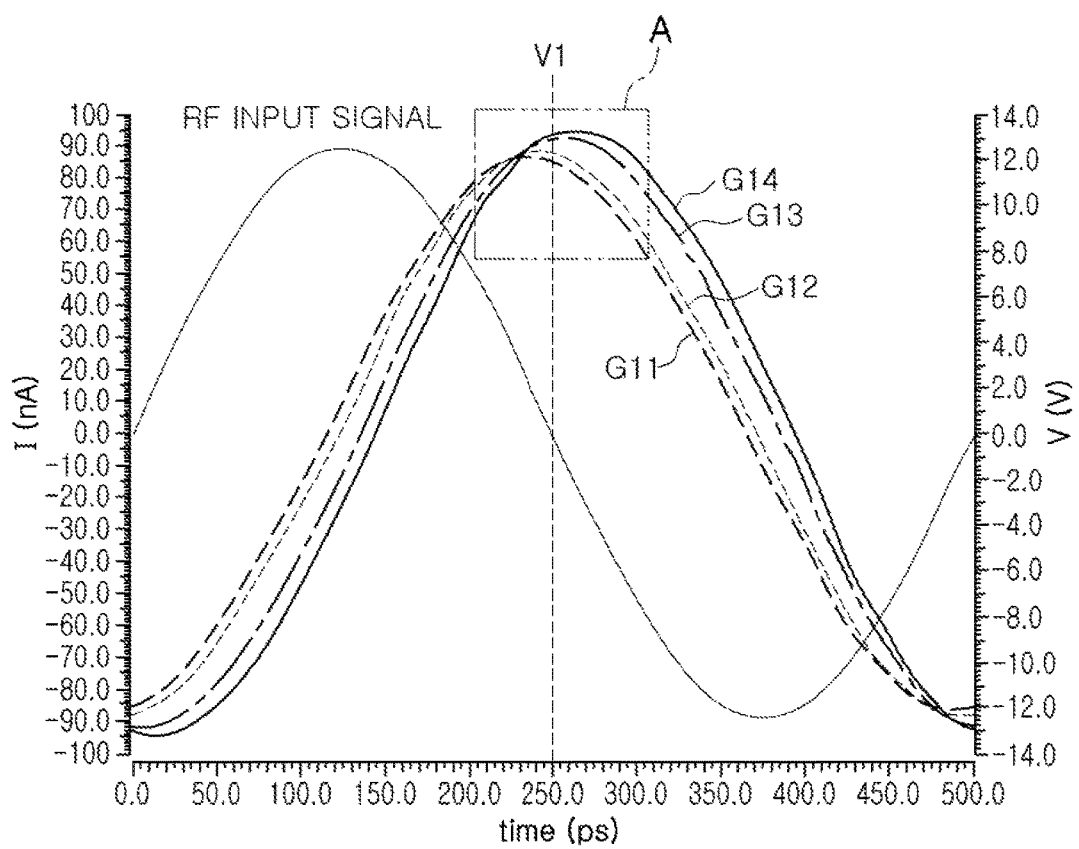
FIG. 9 is a view of an example of an input signal of the transistor and examples of a difference between gate and body leakage currents according to the first capacitance and the second capacitance.
Figure 10:
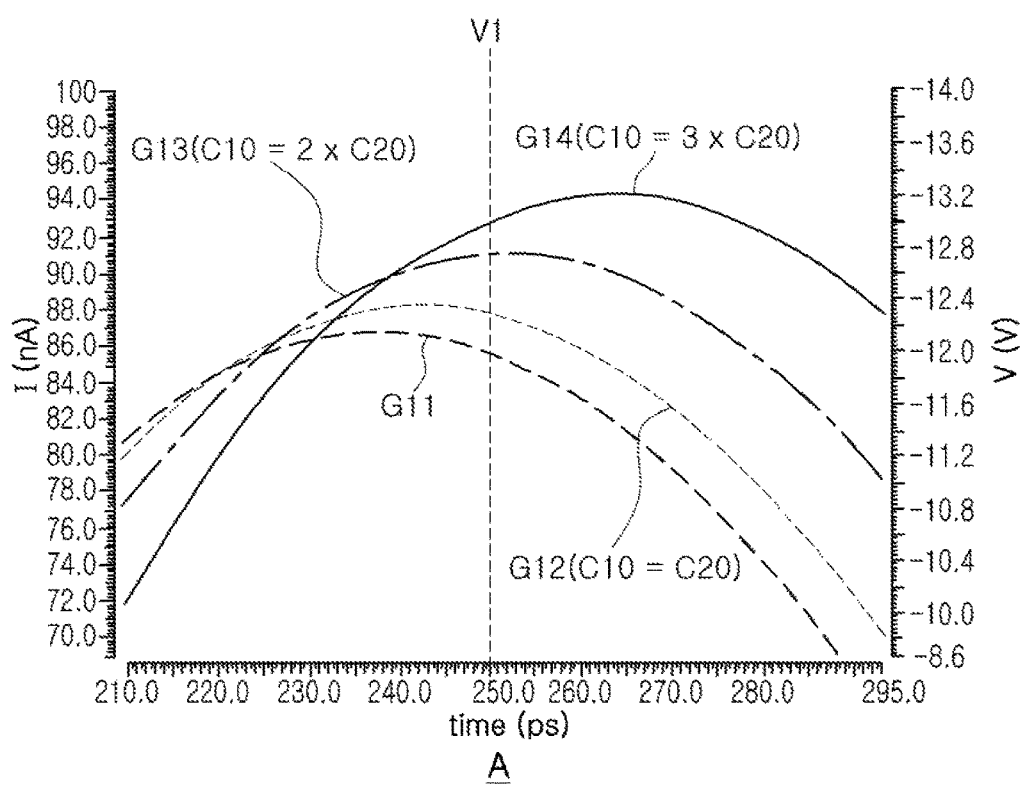
FIG. 10 is an enlarged view of part A of FIG. 9.

FIG. 9 is a view of an example of an input signal of the transistor and examples of a difference between gate and body leakage currents according to the first capacitance and the second capacitance, and FIG. 10 is an enlarged view of part A of FIG. 9.

Graphs illustrated in FIGS. 9 and 10 are graphs showing the RF input signal at the last stage of the switch circuit and differences between the gate and body leakage currents for different values of the first capacitance and the second capacitance when eight FETs having a width of 3 mm are stacked. Referring to G11 to G14 of FIGS. 9 and 10, a point at which a V1 dotted line and the RF input signal meet is the zero crossing point.

In FIGS. 9 and 10, G11 is a graph of the difference between the gate and body leakage currents in a conventional transistor.

G12 is a graph of the difference between the gate and body leakage currents for a case in which the first capacitance C10 of the first capacitor circuit C1-1 is equal to the second capacitance C20 of the second capacitor circuit C1-2 in the conventional transistor.

G13 is a graph of the difference between the gate and body leakage currents for a case in which the first capacitance C10 of the first capacitor circuit C1-1 is equal to two times the second capacitance C20 of the second capacitor circuit C1-2 in the transistor according to an example of this application. That is, G13 is a graph in which the difference between the gate and body leakage currents has a maximum value at the zero crossing point of the RF input signal by setting the first capacitance C10 to be equal to two times the second capacitance C20, and it can be seen that such a graph shows an optimal symmetry and linearity.

In addition, G14 is a graph of the difference between the gate and body leakage currents for a case in which the first capacitance C10 of the first capacitor circuit C1-1 is equal to three times the second capacitance C20 of the second capacitor circuit C1-2 in the transistor according to an example of this application.

Figure 11:
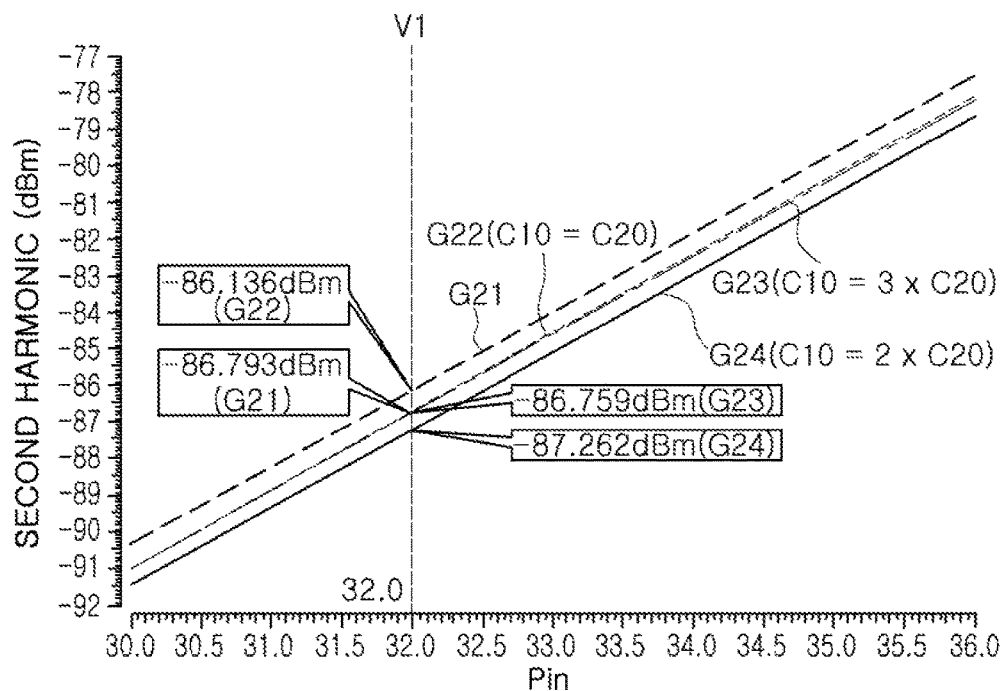
FIG. 11 is a view of examples of a second harmonic characteristics graph.

FIG. 11 is a view of examples of a second harmonic characteristics graph according to conventional examples and examples according to this application.

In FIG. 11, G21 is a graph showing second harmonic characteristics for a conventional transistor, G22 is a graph showing the second harmonic characteristics for the conventional transistor having the first capacitance C10 equal to the second capacitance C20, G23 is a graph showing the second harmonic characteristics for the transistor having the first capacitance C10 equal to three times the second capacitance C20 according to an example of this application, and G24 is a graph showing the second harmonic characteristics for the transistor having the first capacitance C10 equal to two times the second capacitance C20 according to an example of this application.

Referring to G21, G22, G23, and G24 of FIG. 11, from a viewpoint of the optimization of the second harmonic performance, it may be confirmed that the optimal point according to an example of this application is a case in which the transistor has the first capacitance C10 substantially equal to two times the second capacitance C20.

Figure 12:
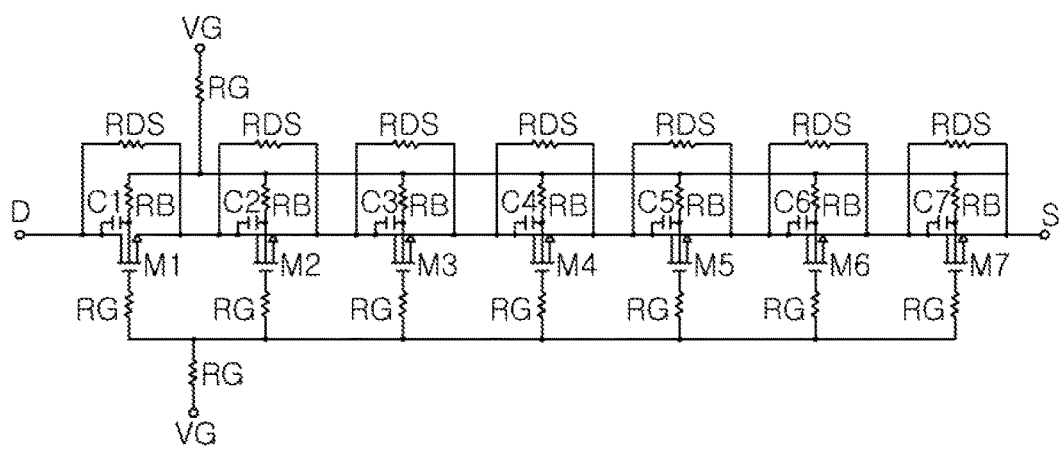
FIG. 12 is a view of an example of a structure of a radio frequency (RF) switch apparatus.

FIG. 12 is a view of an example of a structure of a radio frequency (RF) switch apparatus.

Referring to FIG. 12, in a case in which the radio frequency switch apparatus includes seven transistors M1 to M7, each of the transistors M1 to M7 has a corresponding one of phase compensating capacitors C1 to C7 connected in parallel with the corresponding drain-body junction capacitor between the body and the drain (the input terminal) of the corresponding one of the transistors M1 to M7.

By such a structure, the phase compensating capacitors may be additionally connected to the corresponding transistor so that the maximum value of the difference between the gate and body leakage currents of the transistor occurs at the zero crossing point of the input signal.

In the examples described above, the first capacitance between the body terminal and the input terminal is set to be greater than the second capacitance between the body terminal and the output terminal, thereby reducing the phase difference between the signals across the body and the gate and improving the second harmonic characteristics.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A radio frequency (RF) switch apparatus comprising:
   a signal input terminal;
   a signal output terminal;
   a first transistor comprising a first input terminal connected to the signal input terminal, a first output terminal connected to the signal output terminal, a first gate terminal, and a first body terminal, wherein one of the first input terminal and the first output terminal is a source terminal and another one of the first input terminal and the first output terminal is a drain terminal;
   a first capacitor circuit connected between the first input terminal and the first body terminal; and
   a second capacitor circuit connected between the first body terminal and the first output terminal;
   wherein a first capacitance of the first capacitor circuit is greater than a second capacitance of the second capacitor circuit.

2. The radio frequency switch apparatus of claim 1, wherein the first capacitor circuit comprises:
   a first junction capacitor connected between the first body terminal and the first input terminal; and
   a first phase compensating capacitor connected in parallel with the first junction capacitor.

3. The radio frequency switch apparatus of claim 2, wherein the first phase compensating capacitor comprises a variable capacitor circuit having a capacitance that varies in response to a first external control signal.

4. The radio frequency switch apparatus of claim 2, wherein the first transistor further comprises:
   a body pattern corresponding to the first body terminal; and
   a drain pattern corresponding to the first input terminal; and
   a capacitance of the first phase compensating capacitor depends on an area of an overlap between the body pattern corresponding to the first body terminal and the drain pattern corresponding to the first input terminal.

5. The radio frequency switch apparatus of claim 1, wherein the second capacitor circuit comprises a second junction capacitor connected between the first body terminal and the first output terminal.

6. The radio frequency switch apparatus of claim 1, wherein the first capacitance is greater than the second capacitance and less than three times the second capacitance.

7. A radio frequency (RF) switch apparatus comprising:
   a signal input terminal;
   a signal output terminal; and
   first to n-th switches connected in series between the signal input terminal and the signal output terminal, where n is a natural number of two or more;
   wherein the first switch comprises:
      a first transistor comprising a first input terminal connected to the signal input terminal, a first output terminal, a first gate terminal, and a first body terminal, wherein one of the first input terminal and the first output terminal is a source terminal and another one of the first input terminal and the first output terminal is a drain terminal;
      a first capacitor circuit connected between the first input terminal and the first body terminal; and
      a second capacitor circuit connected between the first body terminal and the first output terminal; and
   a first capacitance of the first capacitor circuit of the first switch is greater than a second capacitance of the second capacitor circuit of the first switch.

8. The radio frequency switch apparatus of claim 7, wherein the first capacitor circuit comprises:
   a first junction capacitor connected between the first body terminal and the first input terminal; and
   a first phase compensating capacitor connected in parallel with the first junction capacitor.

9. The radio frequency switch apparatus of claim 8, wherein the first phase compensating capacitor comprises a variable capacitor circuit having a capacitance that varies in response to a first external control signal.

10. The radio frequency switch apparatus of claim 8, wherein the first transistor further comprises:
    a body pattern corresponding to the first body terminal; and
    a drain pattern corresponding to the first input terminal; and
    a capacitance of the first phase compensating capacitor depends on an area of an overlap between the body pattern corresponding to the first body terminal and the drain pattern corresponding to the first input terminal.

11. The radio frequency switch apparatus of claim 8, wherein the n-th switch comprises:
    an n-th transistor comprising an n-th input terminal connected to an n-1-th output terminal of an n-1-th switch of the first to n-th switches, an n-th output terminal connected to the signal output terminal, an n-th gate terminal, and an n-th body terminal, wherein one of the n-th input terminal and the n-th output terminal is a source terminal and another one of the n-th input terminal and the n-th output terminal is a drain terminal;

a first capacitor circuit connected between the n-th input terminal and the n-th body terminal; and a second capacitor circuit connected between the n-th body terminal and the n-th output terminal;

wherein a first capacitance of the first capacitor circuit of the n-th switch is greater than a second capacitance of the second capacitor circuit of the n-th switch.

12. The radio frequency switch apparatus of claim 7, wherein the second capacitor circuit comprises a second junction capacitor connected between the first body terminal and the first output terminal.

13. The radio frequency switch apparatus of claim 7, wherein the first capacitance is greater than the second capacitance and less than three times the second capacitance.

14. A radio frequency (RF) switch apparatus comprising:
a signal input terminal;
a signal output terminal;
a transistor comprising an input terminal connected to the signal input terminal, an output terminal connected to the signal output terminal, a gate terminal, and a body terminal, wherein one of the input terminal and the output terminal is a source terminal and another one of the input terminal and the output terminal is a drain terminal; and
a capacitor connected between the input terminal and the body terminal and having a capacitance that causes a difference between a gate leakage current of the transistor and a body leakage current of the transistor to occur at substantially a zero crossing point of an RF signal applied to the signal input terminal.

15. The radio frequency switch apparatus of claim 14, wherein a sum of the capacitance of the capacitor and a first junction capacitance between the body terminal and the input terminal is greater than a second junction capacitance between the body terminal and the output terminal.

16. The radio frequency switch apparatus of claim 15, wherein the sum of the capacitance of the capacitor and the first junction capacitance is greater than the second junction capacitance and less than three times the second junction capacitance.

17. The radio frequency switch apparatus of claim 15, wherein the sum of the capacitance of the capacitor and the first junction capacitance is substantially two times the second junction capacitance.

18. The radio frequency switch apparatus of claim 14, wherein the capacitance of the capacitor causes a phase of a gate voltage of the gate terminal to be equal to a phase of a body voltage of the body terminal.

19. The radio frequency switch apparatus of claim 14, wherein the capacitor comprises a variable capacitor circuit having a capacitance that varies in response to an external control signal.

20. The radio frequency switch apparatus of claim 14, wherein the transistor further comprises:
a body pattern corresponding to the body terminal; and
a drain or source pattern corresponding to the input terminal; and
the capacitance of the capacitor depends on an area of an overlap between the body pattern corresponding to the body terminal and the drain or source pattern corresponding to the input terminal.

* * * * *